(12) United States Patent
Ahmad et al.

(10) Patent No.: US 12,146,913 B2
(45) Date of Patent: *Nov. 19, 2024

(54) MODULAR WIRELESS COMMUNICATION DEVICE TESTING SYSTEM

(71) Applicant: T-Mobile USA, Inc., Bellevue, WA (US)

(72) Inventors: Syed Toaha Ahmad, Renton, WA (US); Eric Christie, Lynnwood, WA (US); Zachary Powers, Newcastle, WA (US); Marguerite Eaton, Seattle, WA (US); Derek Klaas, Woodinville, WA (US); Grant Taylor, Seattle, WA (US); Bradley Chew, Cuptertino, CA (US); Natasha Theodora Petrus, Seattle, WA (US); William Ah Tou, Sacramento, CA (US); Yen-Lin Han, Seattle, WA (US)

(73) Assignee: T-Mobile USA, Inc., Bellevue, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/381,854

(22) Filed: Oct. 19, 2023

(65) Prior Publication Data
US 2024/0044980 A1 Feb. 8, 2024

Related U.S. Application Data

(63) Continuation of application No. 17/991,546, filed on Nov. 21, 2022, now Pat. No. 11,828,802, which is a
(Continued)

(51) Int. Cl.
*G01R 31/319* (2006.01)
*G01R 1/07* (2006.01)
(Continued)

(52) U.S. Cl.
CPC ......... *G01R 31/31907* (2013.01); *G01R 1/07* (2013.01); *G01R 31/003* (2013.01); *G01R 31/2849* (2013.01); *G01R 31/312* (2013.01)

(58) Field of Classification Search
None
See application file for complete search history.

(56) References Cited

U.S. PATENT DOCUMENTS

| 3,960,072 A | 6/1976 | Ahlgren et al. |
| 6,657,214 B1 | 12/2003 | Foegelle et al. |

(Continued)

FOREIGN PATENT DOCUMENTS

| CN | 109597139 | 4/2019 |
| CN | 208728032 | 4/2019 |
| WO | WO2008085462 A1 | 7/2008 |

OTHER PUBLICATIONS

Office Action for U.S. Appl. No. 17/991,546, mailed on May 18, 2023, Inventor #1 Syed Toaha Ahmad, "Modular Wireless Communication Device Testing System," 10 pages.
(Continued)

*Primary Examiner* — Jermele M Hollington
(74) *Attorney, Agent, or Firm* — Lee & Hayes, P.C.

(57) ABSTRACT

Arrangements and techniques for testing mobile devices within a test module. The test modules are portable and may be stacked to provide a modular testing system. A pulley system may be used to move an actuator arm horizontally in the X and Y directions. The actuator arm may be moved vertically in the Z direction such that a tip may engage a touchscreen of a mobile device being tested or a user interface element of the mobile device.

20 Claims, 13 Drawing Sheets

Related U.S. Application Data continuation of application No. 16/373,955, filed on Apr. 3, 2019, now Pat. No. 11,506,712.

(60) Provisional application No. 62/693,331, filed on Jul. 2, 2018.

(51) Int. Cl.
*G01R 31/00* (2006.01)
*G01R 31/28* (2006.01)
*G01R 31/312* (2006.01)

(56) References Cited

U.S. PATENT DOCUMENTS

| | | |
|---|---|---|
| 9,798,314 B2 | 10/2017 | Dougherty et al. |
| 10,644,811 B1 | 5/2020 | Cummings |
| 11,506,712 B2 | 11/2022 | Ahmad et al. |
| 11,828,802 B2 * | 11/2023 | Ahmad .............. G01R 31/2849 |
| 2007/0178843 A1 | 8/2007 | Singh et al. |
| 2008/0191725 A1 | 8/2008 | Cojocneanu et al. |
| 2013/0200915 A1 | 8/2013 | Panagas |
| 2015/0355271 A1 | 12/2015 | Rogel-Favila et al. |
| 2016/0042204 A1 | 2/2016 | Tan et al. |
| 2020/0003835 A1 | 1/2020 | Ahmad et al. |
| 2023/0079002 A1 | 3/2023 | Ahmad |

OTHER PUBLICATIONS

Office Action for U.S. Appl. No. 16/373,955, mailed Apr. 7, 2022, Ahmad, "Modular Wireless Communication Device Testing System", 14 pages.

PCT Search Report and Written Opinion mailed on Sep. 25, 2019, for PCT Applicatio No. PCT/US2019/036273, 15 pages.

* cited by examiner

MODULAR WIRELESS COMMUNICATION DEVICE TESTING SYSTEM

PRIORITY CLAIM AND CROSS-REFERENCE TO RELATED APPLICATIONS

This Application is a continuation of and claims priority to U.S. patent application Ser. No. 17/991,546, filed Nov. 21, 2022, now U.S. Pat. No. 11,828,802, issued Nov. 28, 2023, which is a continuation of and claims priority to U.S. patent application Ser. No. 16/373,955, filed Apr. 3, 2019, now U.S. Pat. No. 11,506,712, issued Nov. 22, 2022, which claims priority under 35 USC § 119 (e), to U.S. Provisional Patent Application No. 62/693,331, filed Jul. 2, 2018, which are fully incorporated by reference herein as if fully set forth below.

BACKGROUND

In recent years, mobile telecommunication devices have advanced from offering simple voice calling services within wireless communication networks to providing users with many new features. Mobile telecommunication devices now provide messaging services such as email, text messaging, and instant messaging; data services such as internet browsing; media services such as storing and playing a library of favorite songs; location services; and many others. In addition to the new features provided by the mobile telecommunication devices, users of such mobile telecommunication devices have greatly increased. Such an increase in users is only expected to continue and, in fact, it is expected that there could be a growth rate of twenty times more users in the next few years alone.

With the growth in users of mobile telecommunication devices, the constant stream of mobile communication innovation goes hand in hand with competition among operators of wireless communication networks. Thus, operators of wireless communication networks need to maintain a comprehensive knowledge of the technologies and mobile telecommunication devices that are being released and put into user's hands. One way of maintaining such an understanding is through extensive testing of the mobile telecommunication devices supported by wireless communication networks.

Currently, many different tests are performed on mobile telecommunication devices in order to ensure that manufacturers of such devices are producing the devices in compliance with various standards and protocols for wireless communication networks. Additionally, tests may be performed for safety and network compatibility of the mobile telecommunication devices. Such testing responsibilities may be expensive and time consuming such that operators of wireless telecommunication networks have worked to automate the testing process through the use of robotic test systems. While such robotic testing platforms for simulating user input on mobile telecommunication devices may provide a great deal of savings in time and money over manual methods, current robotic testing platforms are still quite costly, occupy a large amount of precious laboratory space, e.g., laboratory space for testing of mobile telecommunication devices, and still require a significant amount of technician labor, e.g., manual labor.

BRIEF DESCRIPTION OF THE DRAWINGS

The detailed description is set forth with reference to the accompanying figures, in which the left-most digit of a reference number identifies the figure in which the reference number first appears. The use of the same reference numbers in different figures indicates similar or identical items or features.

DETAILED DESCRIPTION

Figure 1:
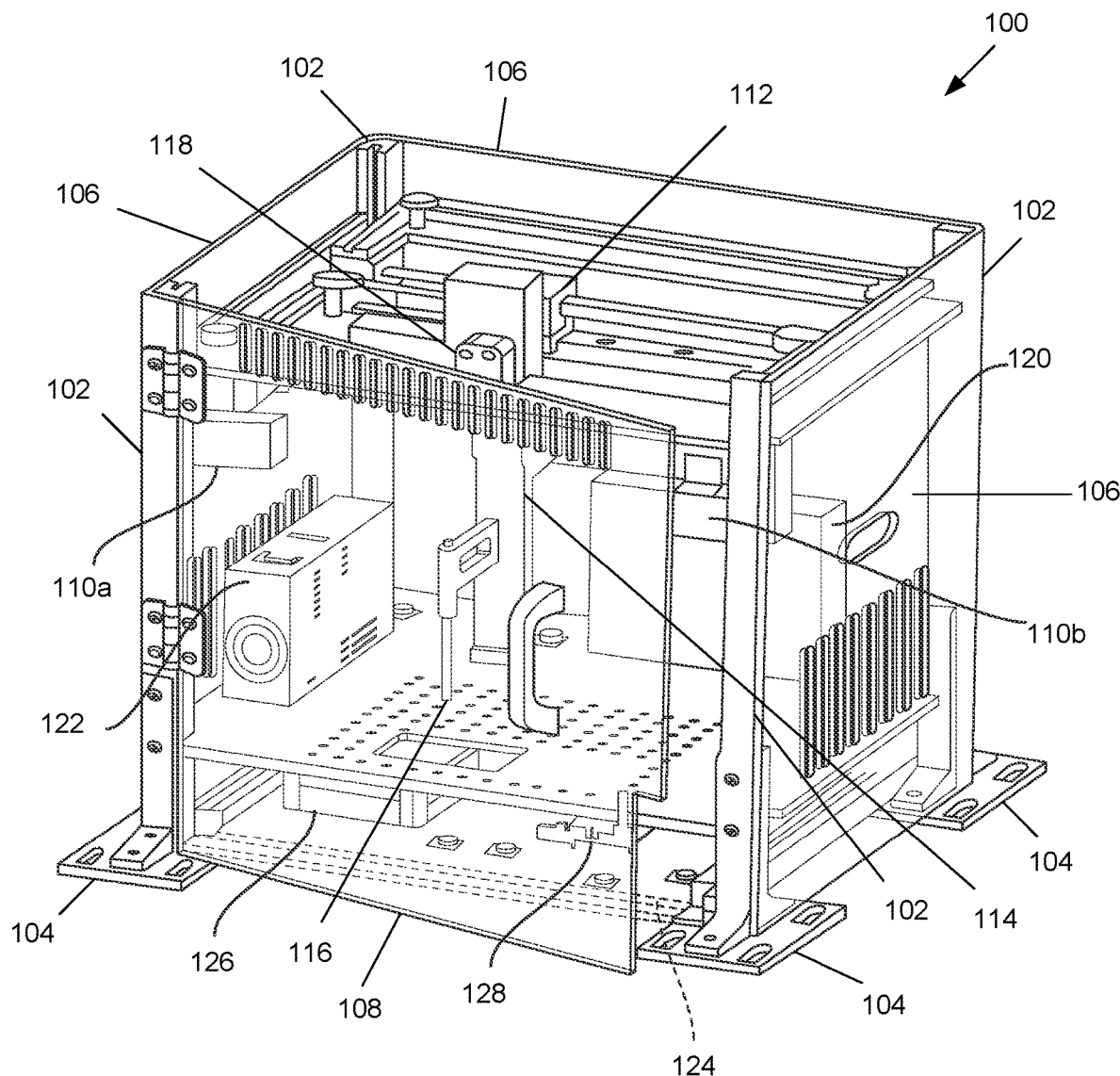
FIG. 1 illustrates an example of a test module for a modular testing system, in accordance with various configurations.

Described herein are arrangements and techniques for testing mobile telecommunication devices, also referred to herein as mobile devices, within modules of a modular mobile device testing system. The modules may be stackable and may be operated remotely from a central host system.

For example, a test room or laboratory space operated by an operator of a wireless communication network may include modules of the modular mobile testing system to test various mobile devices. The mobile devices may comprise any appropriate device, e.g., a stationary device or a portable electronic device, for communicating over a wireless communication network. Examples of such devices include mobile telephones, cellular telephones, internet protocol (IP) telephones, mobile computers, Personal Digital Assistants (PDAs), radio frequency devices, handheld computers, laptop computers, tablet computers, palmtops, pagers, devices configured as IoT devices, IoT sensors that include cameras, integrated devices combining one or more of the preceding devices, and/or the like. As such, the mobile devices may range widely in terms of capabilities and features.

In configurations, each test module may employ radio frequency identification (RFID) to identify and track a device under test (DUT). Each module uses robotic means to affect planar positioning of an orthogonal linear motion system above a fixed DUT. The orthogonal linear motion system engages the device with a manipulation tool, which in configurations is a sprung tip, effecting a validation test. The DUT is held in place by a spring-loaded clamp that presses the device under test against locating pins to produce a repeatable datum point. A camera mounted above the DUT can record video and/or stream video of a screen of the DUT to a computing system during testing, where the computing system controls the test module.

In configurations, each module has an onboard microcontroller that mediates control of the test module. Control commands may be sent from a host or computing device that may be located locally or remotely, then interpreted and implemented by the onboard microcontroller. This allows multiple test modules to be controlled by a single host over any standard network connection, e.g., the Internet. In configurations, the modules of the system are stackable to save space in the testing lab. The modules are also portable to be used at various locations.

In configurations, the orthogonal linear motion system comprises a Core-XY motion concept that has been developed for three-dimensional (3D) printing applications. Such a concept may be used to move a vertical actuator along a horizontal plane, e.g., in X and Y directions, allowing it to be positioned precisely above a DUT. One or more motors and pulleys may be used to drive one or more belts, which can control the horizontal location of the manipulation tool, e.g., the sprung tip. A vertical actuator may then be activated allowing manipulation of the DUT's user interface, e.g., a touchscreen of the DUT and/or User Interface (UI) elements, e.g., buttons, on the DUT. In configurations, the sprung tip comprises a reciprocating rod with a capacitive tip that is mounted to the vertical actuator. Such an arrangement allows for variable force to be applied to the DUT and prevents damage to the device.

FIG. 1 illustrates an example configuration of a test module 100 for a modular testing system in accordance with various configurations. The test module 100 includes, among other components, legs 102 that define a frame. The legs 102 may include feet 104, if desired, to provide extra balance when the test module 100 is placed on a stable surface, e.g., a floor, a table, etc. The feet 104 may not be included to allow for stacking of test modules 100, as will be discussed herein.

Sidewalls 106 may be included, as well as a door 108. As will be described in more detail herein, the test module 100 may include first and second X-Y stepper motors 110a, 110b for moving a carriage assembly 112 in horizontal directions, e.g., in X and Y directions.

The carriage assembly 112 includes an actuator arm 114 that includes a sprung tip 116 for testing of a device under test (DUT) (not illustrated). The actuator arm 114 includes, as will be described further herein, an actuator 118 for moving the sprung tip 116 in a vertical direction, e.g., in the Z direction. An X-Y axis power supply 120 is provided, as is a Z axis power supply 122. In configurations, a single power supply may be provided for providing power to move the carriage assembly 112 and the actuator arm 114 for movement in the X-Y directions, as well as in the Z direction.

The test module 100 also includes a component drawer 124 that includes a controller in the form of a microcontroller or computer 126 mounted thereto. The controller may also include memory 128 that provides random access memory (RAM), read only memory (ROM), etc. One or more of the microcontroller 126 and/or the memory 128 may be in the form of a Solid State Device (SSD).

Figure 2A:
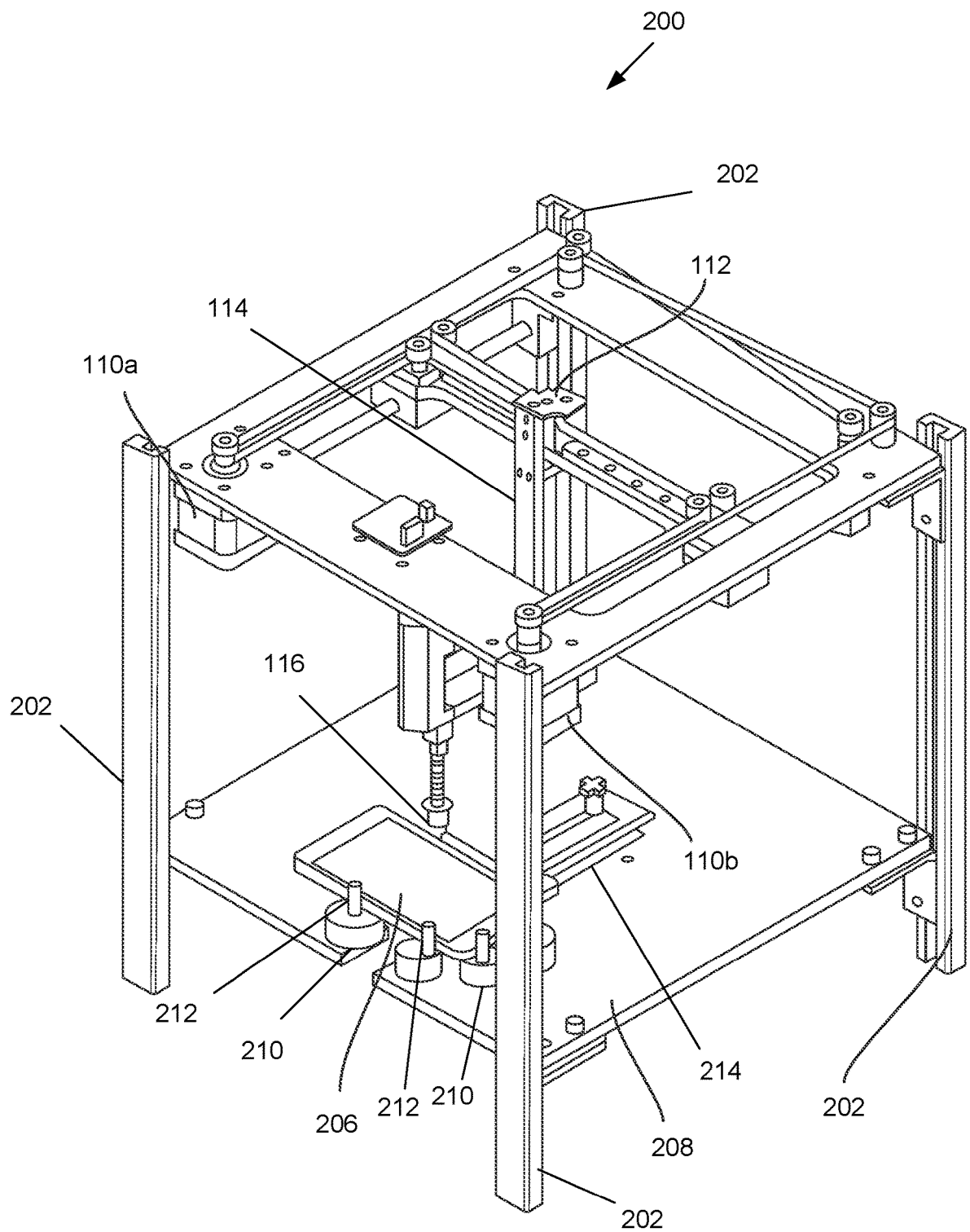
FIG. 2A illustrates an example of a stackable test module similar to the test module illustrated in FIG. 1, in accordance with various configurations.
Figure 2B:
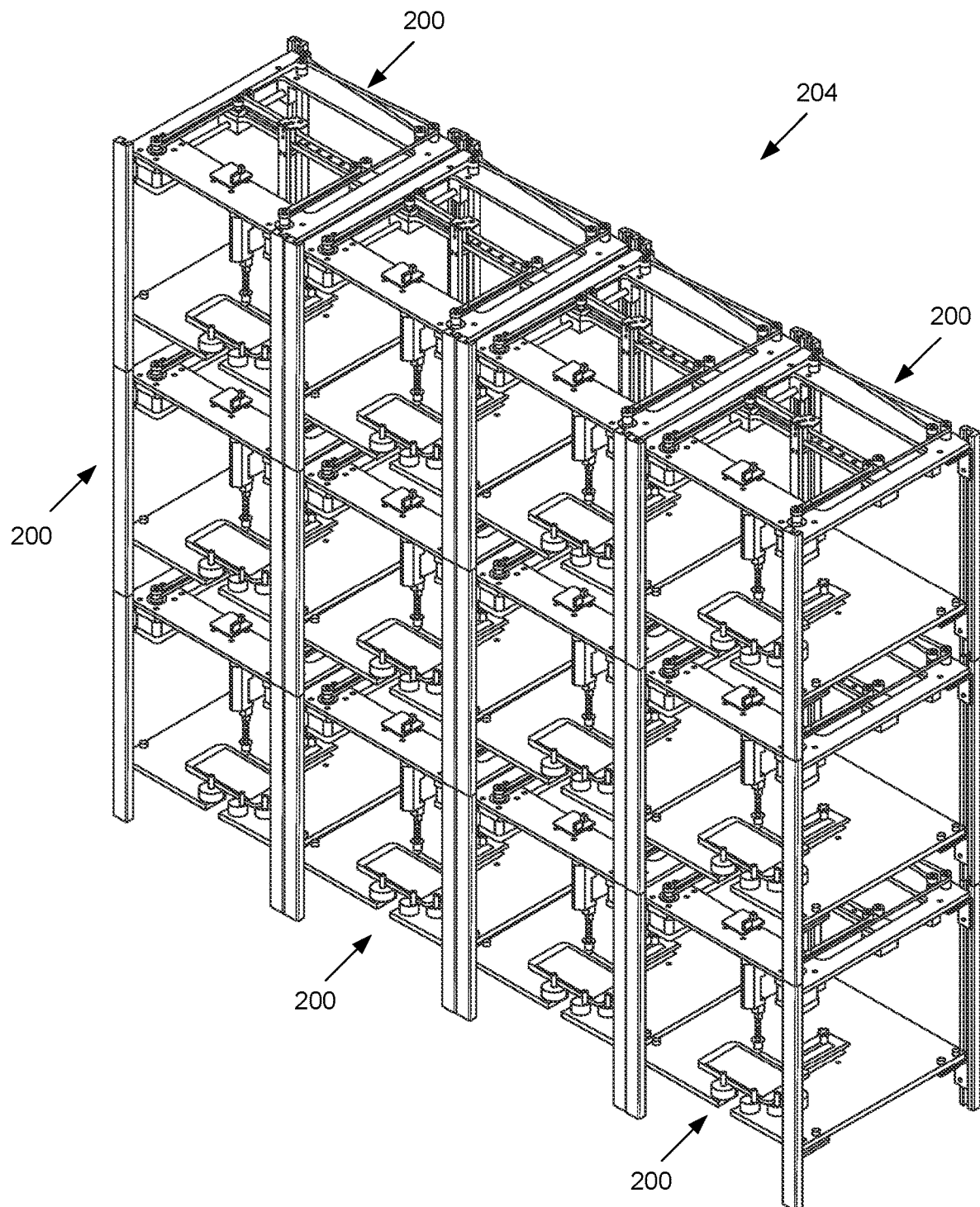
FIG. 2B illustrates an example of stackable test modules of FIG. 2A stacked to provide a modular testing system, in accordance with various configurations.

FIG. 2A illustrates a stackable test module 200 similar to the test module 100, with various components illustrated in FIG. 1 removed. The test module 200 includes legs 202 without the feet 104. The legs 202 are formed with t-slot extrusions to allow for the stacking of test modules 200 as illustrated in FIG. 2B. Thus, the test module 200 may be stacked on other test modules 200, as may be seen in FIG. 2B, to provide a modular testing system 204 comprising multiple test modules 200. In configurations, test modules 200 on the bottom of the testing system 204 may be considered base test modules and may or may not include feet 104 (not illustrated in FIG. 2B).

The test module 200 also includes a DUT 206 on a test bed 208 above the drawer 124 (not illustrated in FIG. 2A). The DUT 206 is illustrated supported by leveling spacers 210, which in configurations may comprise rubber, and held in place by adjustable pins 212 and a clamp assembly 214, as will be described further herein. The test module 200 also includes a pulley system 216 driven by stepper motors 110a, 110b to move the carriage assembly 112 and thereby the actuator arm 114 and sprung tip 116, as will be described further herein.

Figure 3:
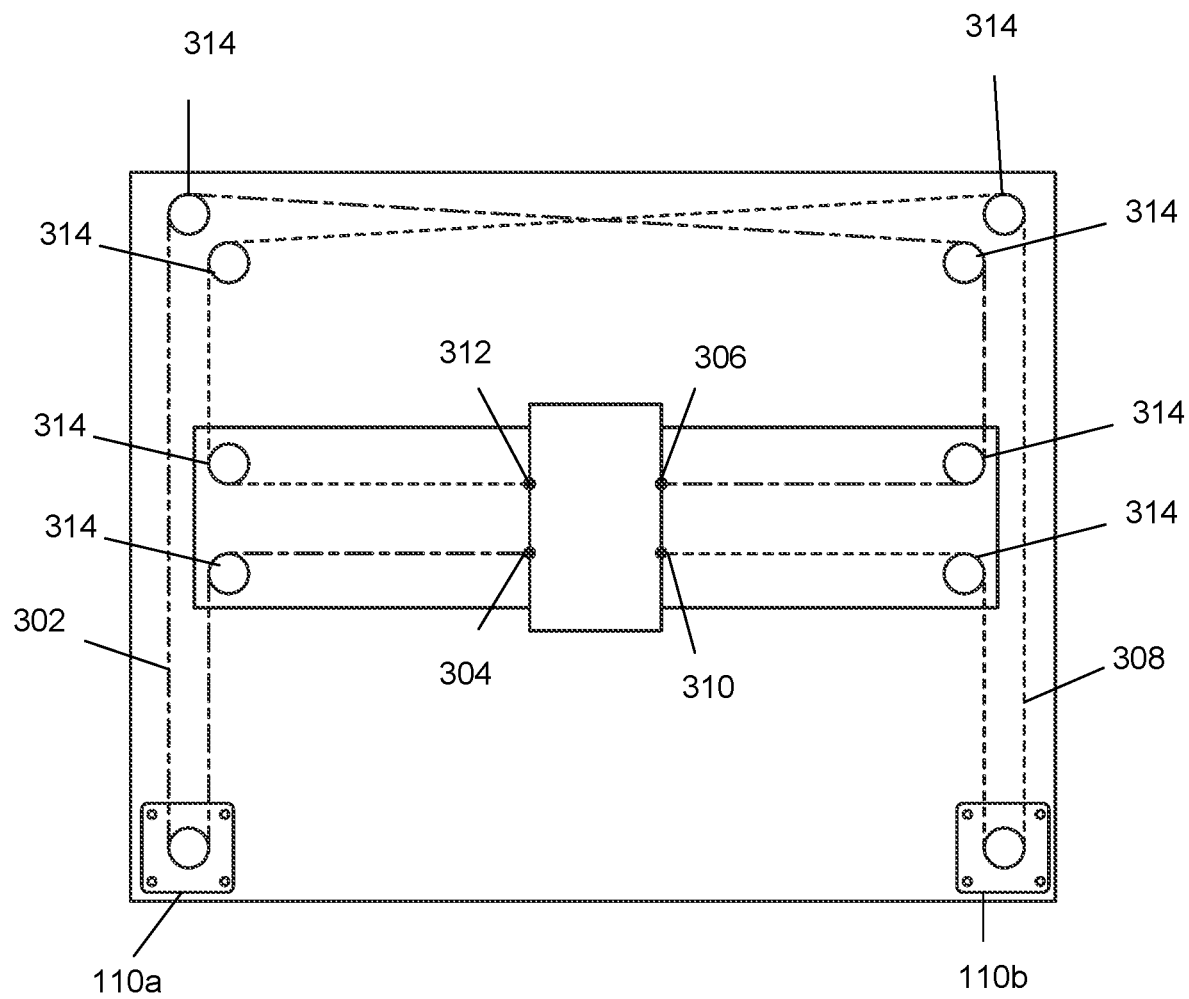
FIG. 3 schematically illustrates a motion system for moving a carriage assembly of the test module of FIG. 1 horizontally in the X and Y directions, in accordance with various configurations.

FIG. 3 schematically illustrates a motion system 300, e.g., pulley system 216, for moving the carriage assembly 112 horizontally in the X and Y directions. As may be seen, the first stepper motor 110a drives a first belt 302 attached to the carriage assembly 112 at 304 and 306. A second belt 308 is also coupled to the carriage assembly 112 at 310 and 312 and is driven by the second stepper motor 110b. The belts 302, 308 engage multiple pulleys 314. The motion system 300 is often referred to as a Core-XY methodology.

Figure 4:
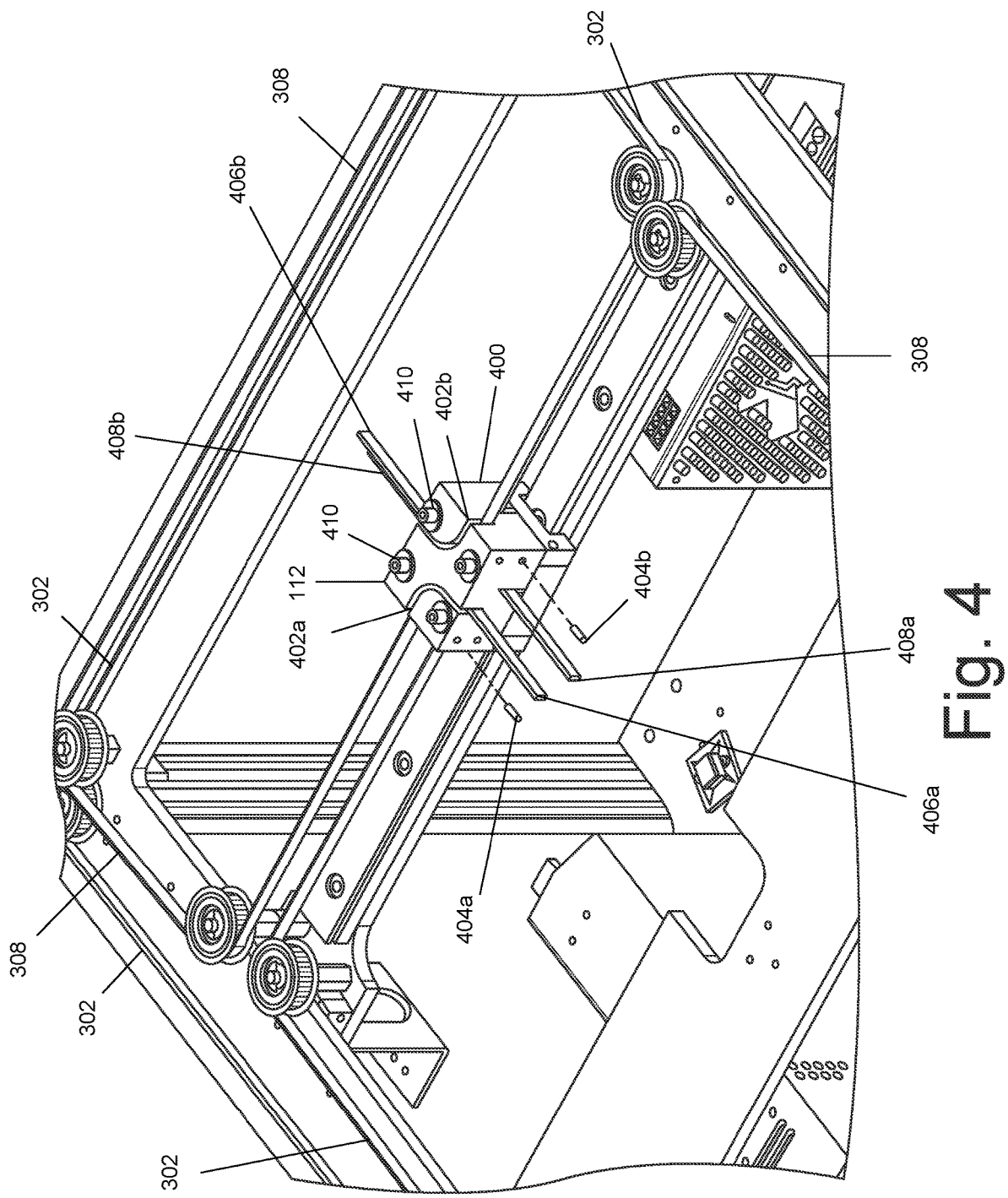
FIG. 4 is a close-up view of the belts of the motion system attached to a top portion of the carriage assembly, in accordance with various configurations.

FIG. 4 provides a close-up view of the belts 302, 308 positioned within a top portion 400a of the carriage assembly 112. The second belt 308 is located in the top portion 400a of the carriage assembly 112 in slots 402a, 402b. Set screws 404a, 404b may be used to secure the belts within the slots 402a, 402b. The second belt 308 is above the first belt 302. Thus, the first belt 302 is located in similar slots (not illustrated) in a lower portion 400b of the carriage assembly 112 and secured with set screws (not illustrated). Ends 406a, 406b of the second belt 308 and ends 408a, 408b of the first belt 302 may be trimmed off after the belts 302, 308 are secured within the carriage assembly 112. Bolts 410 may also be used to tension and align the belts 302, 308 within the slots of the carriage assembly 112. Thus, the slots, set screws and/or bolts allow for simple tensioning and alignment of the belt.

Figure 5:
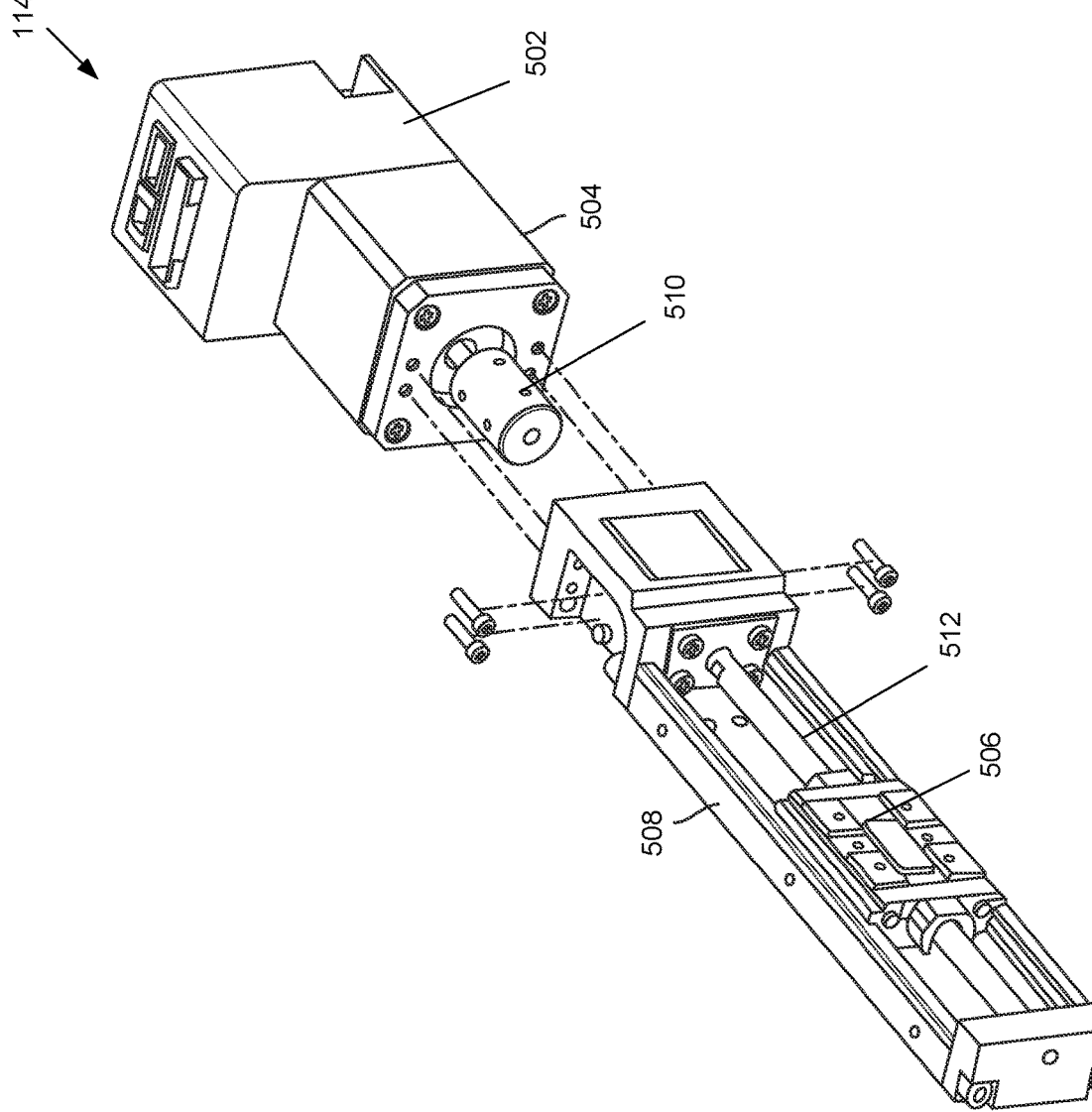
FIG. 5 is a partial exploded view of an actuator arm of the test module of FIG. 1, in accordance with various configurations.

FIG. 5 provides a partial exploded view of the actuator arm 114 that is coupled to and extends from the carriage assembly 112. The actuator arm 114 includes a base 502 that includes a motor 504 for actuating and moving an actuator bracket 506 vertically, e.g., in the Z direction. Thus, the base 502 and the motor 504 may serve as the actuator 118. An actuator arm body 508 is coupled to the base 502 such that a shaft 510 of the motor 504 is within the actuator arm body 508 and engages an actuator shaft 512. The actuator shaft 512 moves the actuator bracket 506 along the actuator shaft 512 when the actuator shaft 512 rotates.

Figure 6A:
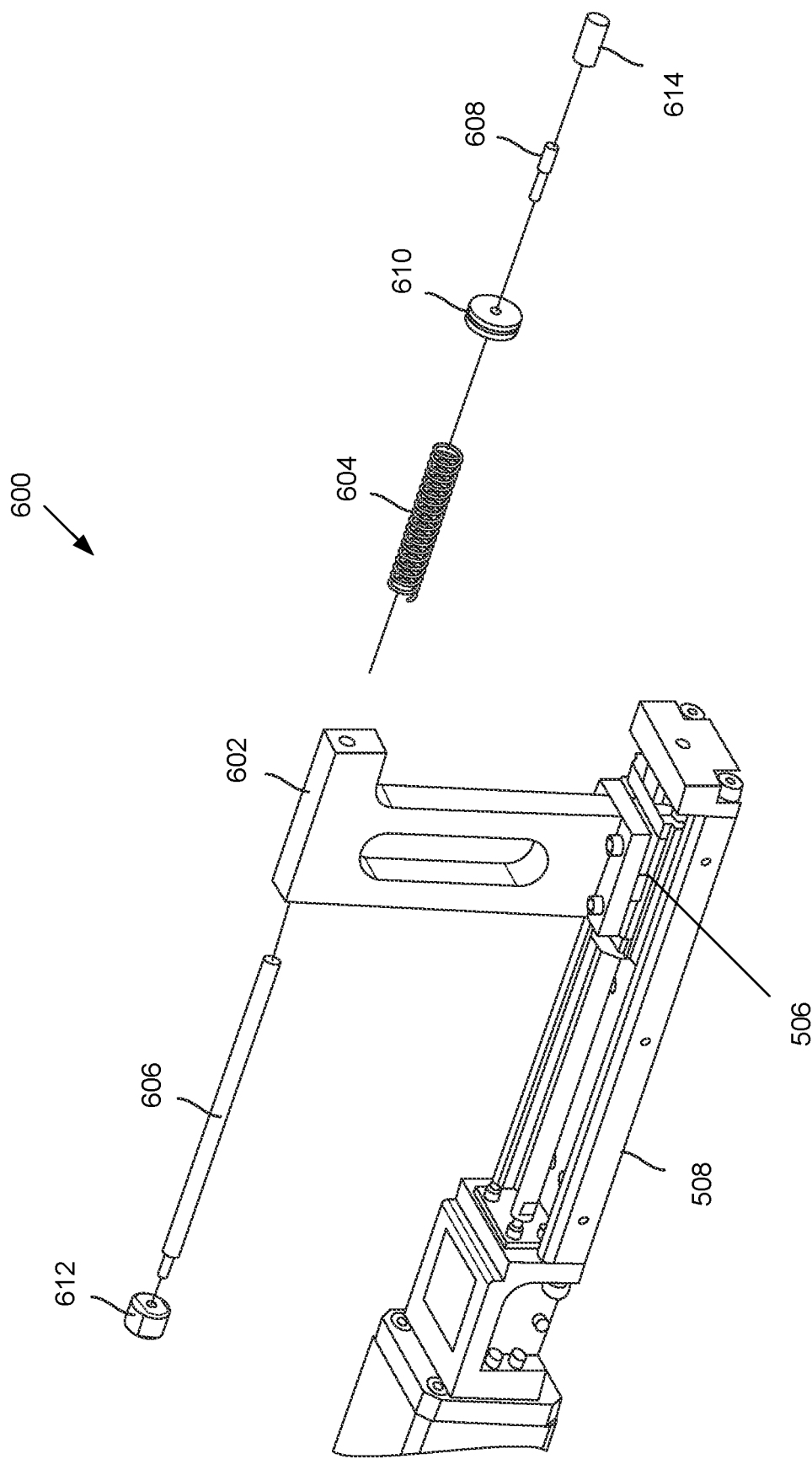
FIG. 6A is an exploded view of an actuator arm assembly for use with the actuator arm, in accordance with various configurations.
Figure 6B:
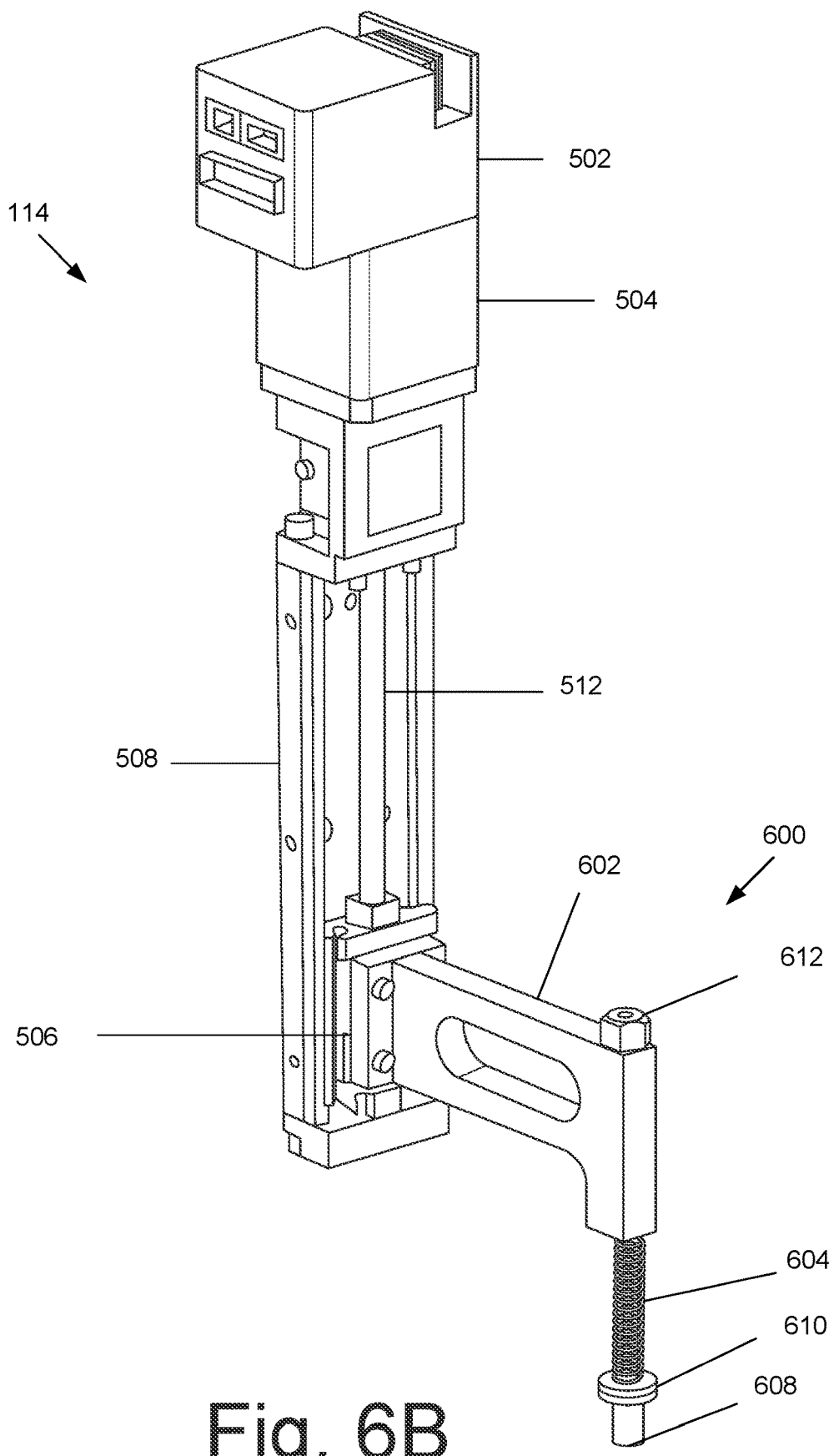
FIG. 6B illustrates a completed actuator arm for use with the test module of FIG. 1, in accordance with various configurations.

FIG. 6A is an exploded view of an actuator arm assembly 600 that may be used as an actuator arm 114. The actuator arm assembly 600 includes an actuator arm mount 602 coupled to the actuator bracket 506. A spring 604 serves as a force regulator and includes an actuator rod 606 that is fed through the actuator arm mount 602 and engages the spring 604. A tip shaft 608 is fed through a washer 610 to engage the spring 604 and a nut 612 is placed over the opposite end of the actuator rod 606 to secure components to the actuator arm mount 602. A tip 614, which in configurations may comprise rubber, is placed over an end of the tip shaft 608. FIG. 6B illustrates the completed actuator arm 114 that may be coupled to the carriage assembly 112 so that the actuator arm 114 may be moved horizontally in the X and Y directions and vertically in the Z direction.

Figure 7:
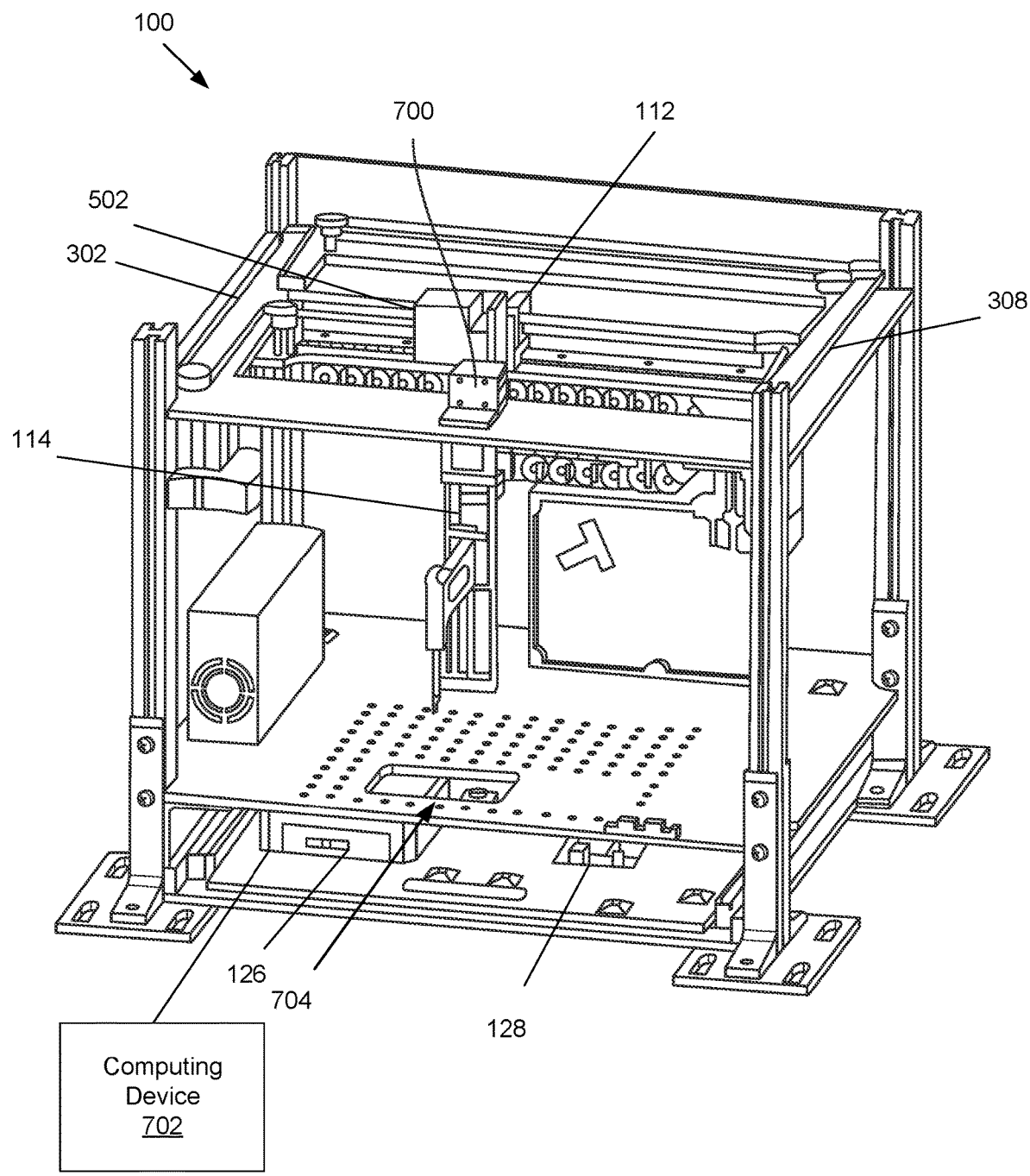
FIG. 7 is another view of a test module that illustrates the actuator arm coupled to the carriage assembly, in accordance with various configurations.

FIG. 7 is another view of a test module 100 that illustrates the actuator arm 114 coupled to the carriage assembly 112. The base 502 may be coupled to the carriage assembly 112 with appropriate hardware (not illustrated) such as, for example, screws, rivets, etc. The test module 100 illustrated in FIG. 7 does not include the sidewalls 106 or the door 108. The component drawer 124 is included below the test bed 208. A camera 700 may be included for providing video during testing operations.

In configurations, the video may be live streamed to a computing device or computing system 702, e.g., a remote server. However, in configurations, the computing device 702 may be located locally. The computing device 702 may control the test module 100 by communicating with the microcontroller 126 to control movement of the carriage assembly 112, and thereby the actuator arm 114, to test DUTs 206. The communication may be over a network, e.g., the Internet. The computing device 702 may provide test instructions to the microcontroller 126 in the form of individual movement commands that are provide as low-level instructions. The microcontroller 126 may also receive test results electronically from DUTs 206 in addition to the video from the camera 700 and may provide the results to the computing device 702. Thus, the orchestration, timing, analysis of results, etc. of testing of DUTs 206 by the test module 100 may be handled remotely with respect to the test module 100 by the computing device 702.

In configurations, the computing device 702 may control multiple test modules 100 in concert. Such control of multiple test modules 100 in concert enables live testing of features of DUTs 206 such as, for example, group texting. In configurations, the microcontroller 126, or some other component (not illustrated) may record the video.

The camera 700 may record video and/or still pictures. The computing device 702 communicates with the microcontroller 126 and may be located locally or remotely. The camera 700 may provide the video and/or still pictures to the microcontroller 126, the memory 128 and/or the computing device 702. As can be seen, the camera 700 is located between the two belts 302, 308 above a DUT test area 704 so that the belts 302, 308 do not interfere with the camera's recording of testing operations of a DUT 206 (not illustrated in FIG. 7).

Figure 8:
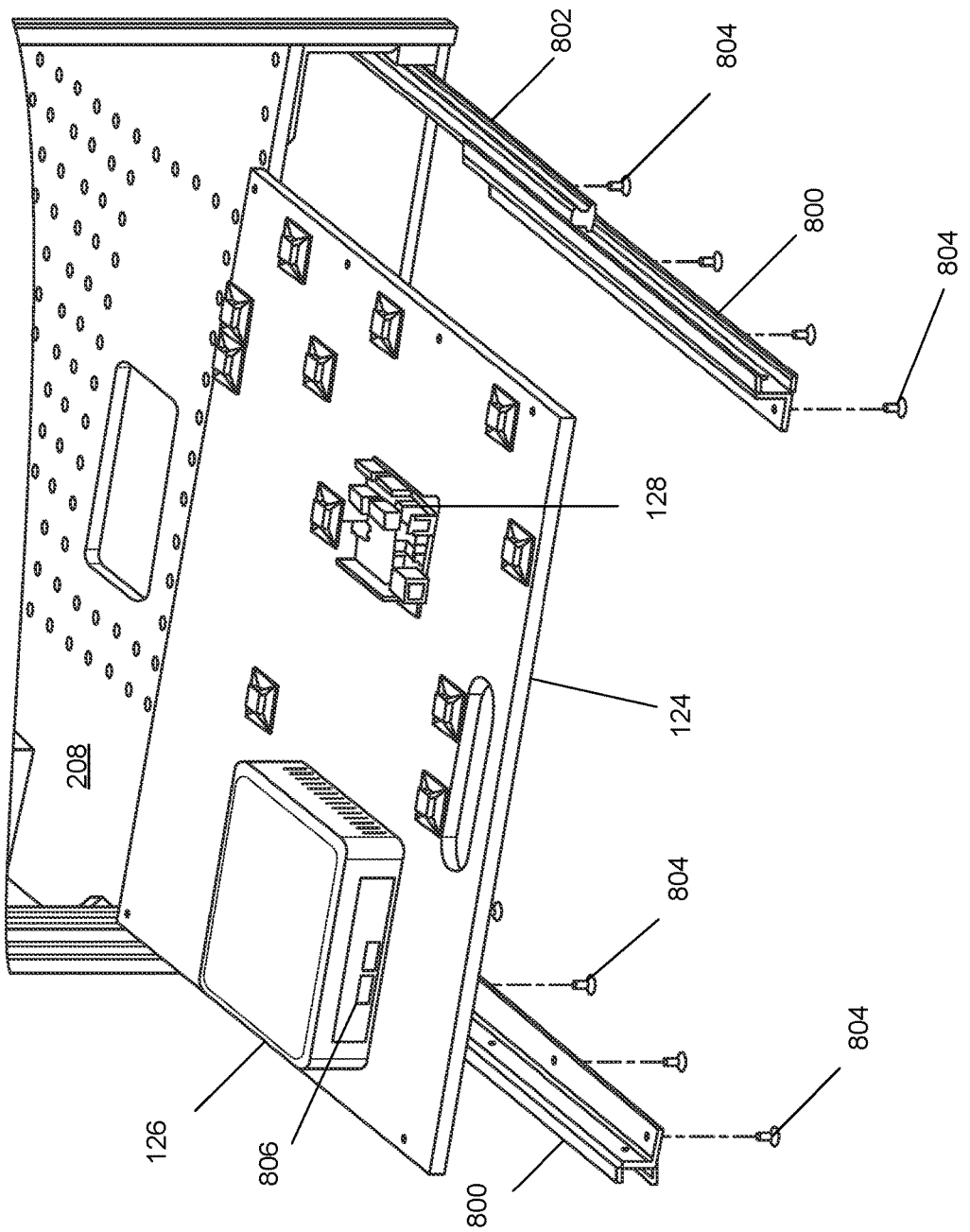
FIG. 8 is a partial exploded view of a component drawer of the test module of FIG. 1, in accordance with various configurations.

FIG. 8 is a partial exploded view that illustrates the component drawer 124 being mounted to and connected to cooperating arms 800, 802 with screws 804 so that the component drawer 124 may slide in and out below the test bed 208. As previously noted, the component drawer 124 includes a microcontroller or computer 126 and memory 128. The microcontroller 126 controls the various components of the test module 100 for performing tests of mobile devices. The microcontroller 126 may include a status indicator 806, e.g., one or more light emitting diodes (LEDs) that indicate a status of the test module, e.g., on, off, testing, testing complete, etc.

The microcontroller 126 may communicate with the computing device 702 to control the test module 100 for testing of mobile devices or may be controlled directly. For example, test or control commands may be received by the microcontroller 126 that may be used to control movement of the carrier assembly 112 and/or the actuator arm 114.

Figure 9:
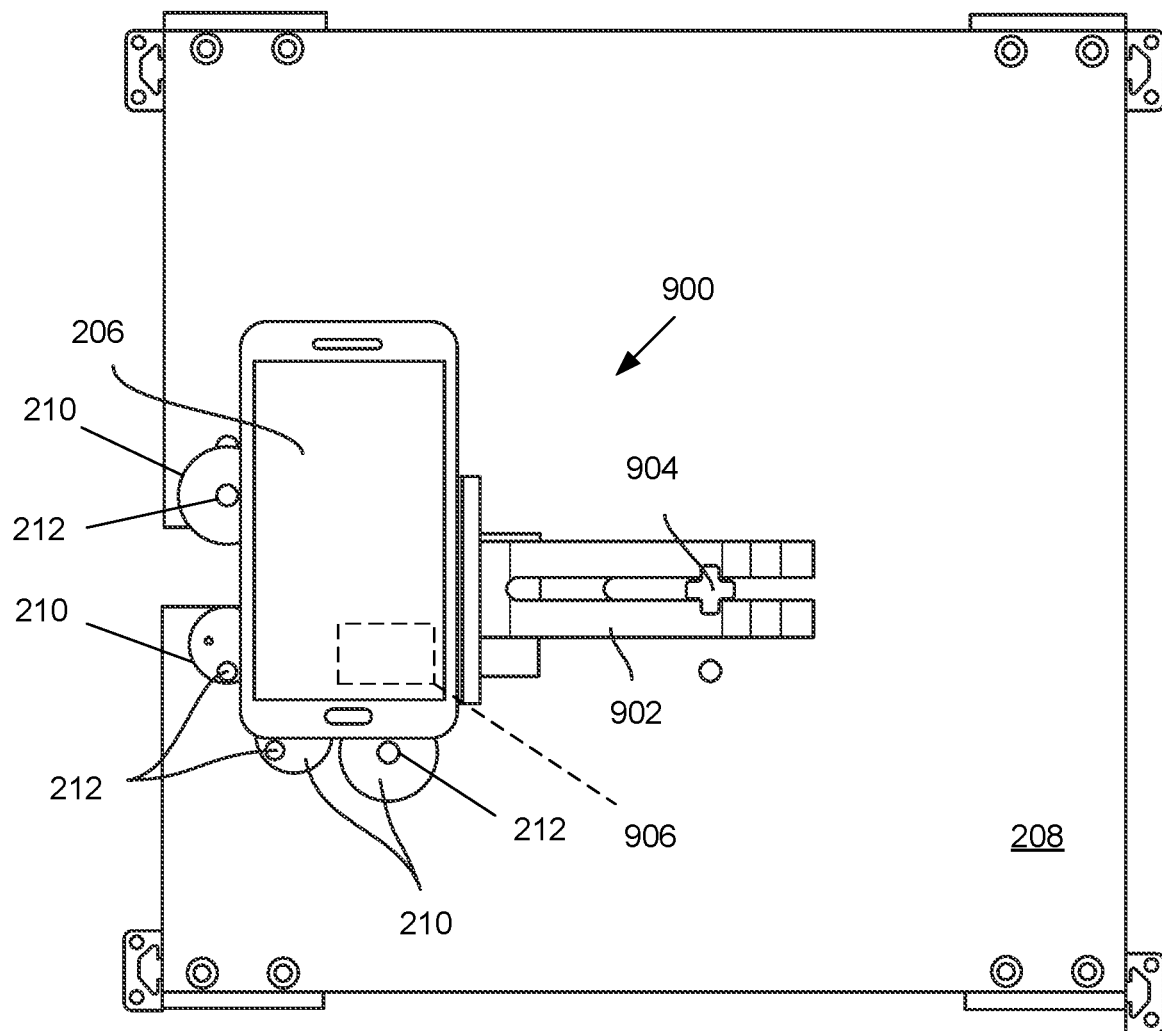
FIG. 9 is an overhead view of an example device platform for securing a mobile device as a device under test (DUT) on a test bed of the test module of FIG. 1, in accordance with various configurations.

FIG. 9 provides an overhead view of an example device platform 900 for securing a mobile device as a DUT 206 on the test bed 208 for testing in the test module 100. The device platform 900 may include spacers 210, which in configurations are rubber leveling spacers, and adjustable index pins 212. The spacers 210 and index pins 212 may be adjusted vertically and/or may be moved to different positions on the test bed 208. A DUT 206 may be placed on the spacers 210 and against the index pins 212. An adjustable clamp 902 may engage the DUT 206 and hold the DUT 206 in place against the index pins 212. The adjustable clamp 902 may be moved to engage the DUT 206. A clamp set screw 904 may be used to secure the adjustable clamp 902 against the DUT 206. Thus, such an arrangement allows for testing of various sized mobile devices.

A Radio-Frequency Identification (RFID) antenna 906 may be provided with the test module 100 to identify mobile devices being tested based upon RFID. The RFID antenna 906 may be attached to the test bed 208 under the DUT 206 and may read a small RFID label attached to the back of a DUT 206. The RFID label contains information identifying the DUT 206 and can be used to gather test data from a central database (not illustrated) that stores test results and/or from the memory 128. The spacers 210 help provide clearance between the DUT 206 and the RFID antenna 906.

Figure 10:
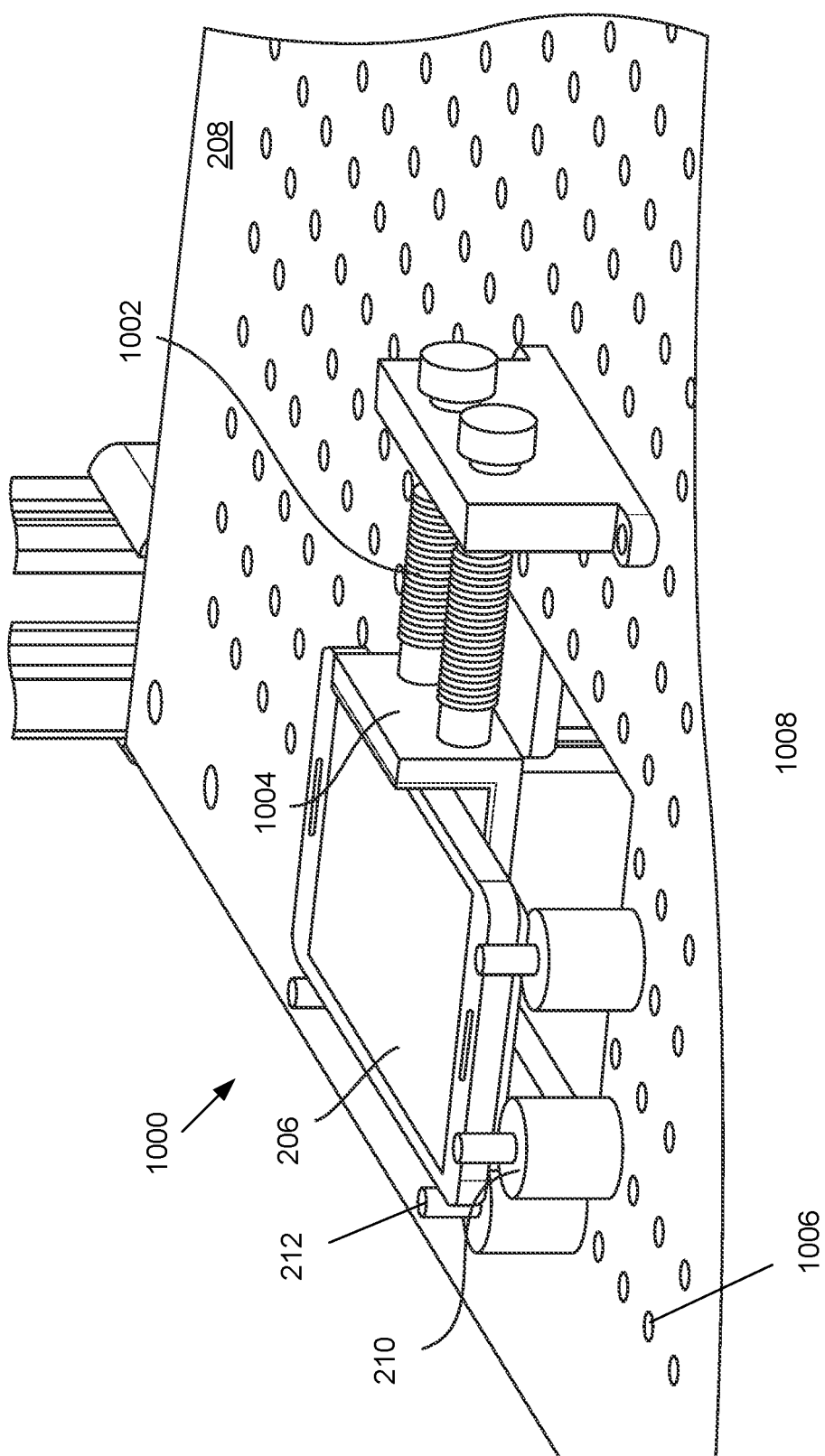
FIG. 10 illustrates another example device platform for use with the test module of FIG. 1, in accordance with various configurations.

FIG. 10 illustrates another example device platform 1000 for use with the test module 100. The device platform 1000 includes leveling spacers 210 and index pins 212. The spacers 210 and index pins 212 may be adjusted vertically and/or may be moved to different positions on the test bed 208. For example, the index pins 212 may be moved to engage different holes 1006 defined within the test bed 208. Two spring-loaded pins 1002 are utilized to secure a clamp 1004 against the DUT 206 in order to secure the DUT against pins 212 for testing.

Thus, during testing, the actuator arm 114 may be moved horizontally, in the X and/or Y direction(s), over the DUT 206 using the pulley system 216/motion system 300. The actuator arm mount 602 may be moved up and down, e.g., in the Z direction, such that the tip 614 engages the DUT 206 to perform various tests. The tip 614 of the stylus assembly 600 may engage a screen of the DUT 206, e.g., a touchscreen, and/or User Interface (UI) elements, e.g., physical buttons, on the DUT 206 for performing the various tests. Additionally, the washer 610 may be used to engage UI elements, e.g., physical buttons, on a side of the DUT 206 for performing various tests.

Testing with the test module 100 is provided by robotic manipulation of the actuator arm 114 to provide inspection of a mobile device such as a DUT 206. Mechanically, this involves two primary operations. First, the test module 100 translates the actuator arm 114 in the horizontal (XY) plane with sufficient accuracy and precision to reliably locate elements on the DUT 206, including the touchscreen and any physical buttons. Second, the stylus assembly 600 moves in the vertical (Z) plane in order to contact the DUT's touchscreen, as well as any physical buttons, with the appropriate force to trigger user interface (UI) elements of the DUT 206.

Movement of the tip 614 in the vertical direction simulates the tapping motion of a human finger and allows the test module 100 to activate UI elements. A key constraint in this operation is that the force applied to the touchscreen should be controllable to accommodate variable force touchscreens, and measurable to provide test validation data. In configurations, the sprung stylus arrangement of the stylus assembly 600 controls the force applied to the DUT's touchscreen based upon the spring 604 in combination with the actuator rod 606.

Translation in the Z direction may be accomplished by the actuator arm 114 using a linear actuator control (LAC) board (not illustrated) to control movement of the actuator bracket 506 by rotation of the actuator shaft 512, and thereby move the actuator arm assembly 600. The LAC board and the motor 504 provides potentiometer feedback allowing for real-time positional control. The actuator arm assembly 600 utilizes the spring 604 and the tip 614, which may be a capacitive tip in configurations. As shown in FIGS. 6 and 7, the tip 604 is located on the end of the actuator rod 606. As the actuator rod 606 pushes the tip 614 of the stylus assembly 600 into the touchscreen of the DUT 206, the tip 614 compresses the spring 604 against the actuator rod 606. As a result, the force applied to the touchscreen of the DUT 206 is a smooth function of the vertical position of the actuator arm 114, and the elastic constant of the spring 604. Hence, the force applied to the DUT 206 may be accurately controlled and measured.

Figure 11:
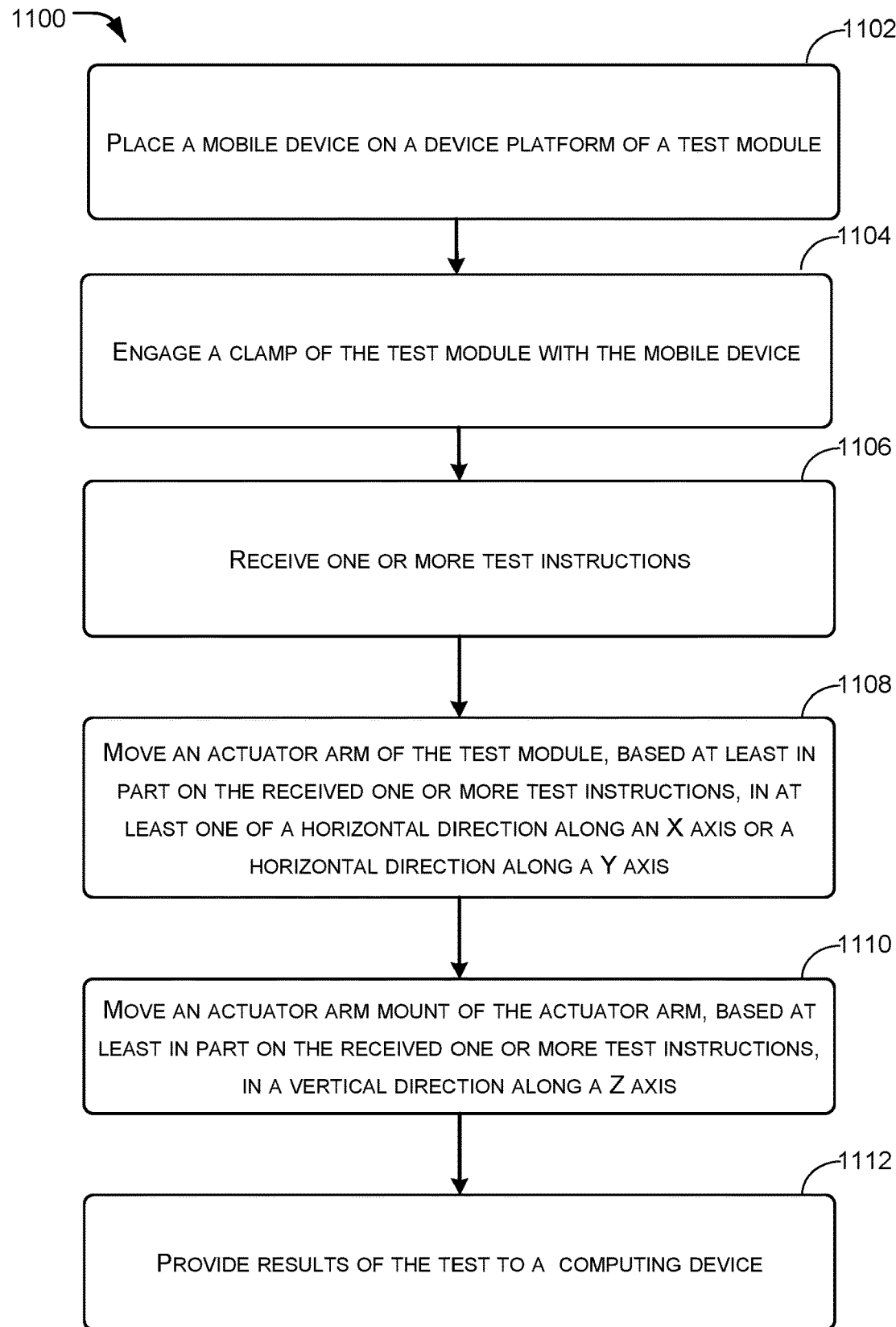
FIG. 11 is a flowchart illustrating a method of testing mobile devices within the test module of FIG. 1, in accordance with various configurations.

FIG. 11 is a flow diagram of an illustrative process that may be implemented within or in association with the test module 100 and/or the testing system 204. This process (as well as other processes described throughout) is illustrated as a logical flow graph, each operation of which represents a sequence of operations that can be implemented in hardware, software, or a combination thereof. In the context of software, the operations represent computer-executable instructions stored on one or more tangible computer-readable storage media that, when executed by one or more processor(s), perform the recited operations. Generally, computer-executable instructions include routines, programs, objects, components, data structures, and the like that perform particular functions or implement particular abstract data types. The order in which the operations are described is not intended to be construed as a limitation, and any number of the described operations can be combined in any order and/or in parallel to implement the process. Furthermore, while the architectures and techniques described herein have been described with respect to wireless networks, the architectures and techniques are equally applicable to processor(s) and processing cores in other environments and computing devices.

FIG. 11 is a flow diagram illustrating an example method 1100 of testing mobile devices, e.g., DUTs 206, within a test module, e.g., test module 100. As illustrated, at block 1102, the mobile device is placed on a device platform, e.g., device platforms 900, 1000, of the test module, the device platform comprising a plurality of adjustable pins, e.g., index pins 212 and spacers, e.g., spacers 210. At block 1104, a clamp, e.g., clamps 902, 1004, of the test module engages the mobile device. At block 1106, a controller, e.g., microcontroller 126, of the test module receives from a computing device, e.g., computing device 702, one or more test instructions to be performed. Thus, one or more test instructions may be provided by, for example, a server, which may be located remotely or locally. The server may provide test instructions to multiple test modules to thereby provide live testing of features of mobile devices, such as, for example, group texting.

At block 1108, an actuator arm, e.g., actuator arm 114, of the test module is moved, based at least in part on the received one or more test commands, in at least one of a horizontal direction along an X axis or a horizontal direction along a Y axis such that an actuator arm mount coupled to the actuator arm is located over a screen of the mobile device. In configurations, the actuator arm is moved by the controller using a motion system, e.g., the motion system 300, based at least in part on the test. At block 1110, the actuator arm mount is moved, based at least in part on the received one or more test commands, in a vertical direction along a Z axis such that one of (i) a tip coupled to the actuator arm mount engages the screen or (ii) the tip engages a User Interface (UI) element of the mobile device. In configurations, the vertical movement is based at least in part on the test. At block 1112, results of the test are provided to the computing device.

Thus, testing of mobile devices may be performed within individual test modules 100. The test modules 100 are portable and thus, may be easily moved by carrying the test modules 100. Also, the test modules 100 may be stacked atop one another to provide testing systems and arrangements that may test multiple mobile devices.

Although the subject matter has been described in language specific to structural features and/or methodological acts, it is to be understood that the subject matter defined in the appended claims is not necessarily limited to the specific features or acts described. Rather, the specific features and acts are disclosed as exemplary forms of implementing the claims.

The invention claimed is:

1. A test module for testing mobile devices, the test module comprising:
 a frame;
 a test bed coupled to the frame;
 a device platform coupled to the test bed and configured to hold a Device Under Test (DUT);
 a motion system coupled to the frame and configured to move a carriage assembly horizontally along an X axis and a Y axis, the motion system comprising:
  a first belt and a second belt;
  a first set of pulleys and a second set of pulleys; and
  a first motor and a second motor,
  wherein the first belt is engaged with the first set of pulleys and the first motor, and
  wherein the second belt is engaged with the second set of pulleys and the second motor;
 an actuator arm coupled to the carriage assembly;
 an actuator arm mount coupled to the actuator arm, the actuator arm mount configured to move vertically along a Z axis and engage the DUT; and
 a controller configured to control the motion system and the actuator arm to perform various tests with respect to the DUT; and
 a sliding drawer movably coupled to the frame below the test bed, the sliding drawer being configured to slide at least partially out from below the test bed,
  wherein the sliding drawer is movable relative to the test bed, and
  wherein the controller is mounted on the sliding drawer.

2. The test module of claim 1, wherein the actuator arm mount comprises:

a capacitive tip configured to engage a screen of the DUT and one or more User Interface (UI) elements of the DUT.

3. The test module of claim 2, wherein the actuator arm mount comprises a shaft and a coil spring coupled to the capacitive tip.

4. The test module of claim 1, further comprising:
a Radio-Frequency Identification (RFID) antenna mounted on the device platform, the RFID antenna configured to identify the DUT to the controller.

5. The test module of claim 1, wherein the controller comprises one or more of:
a computer;
Random Access Memory (RAM); or
a Solid State Drive (SSD).

6. The test module of claim 1, wherein the controller is configured to communicate with a computing device for testing the DUT and for providing results of the testing to the computing device.

7. The test module of claim 1, further comprising a camera coupled to the frame above the device platform.

8. The test module of claim 1, wherein the device platform comprises:
a plurality of spacers configured to support the DUT;
a plurality of adjustable pins configured to engage the DUT; and
a spring-loaded clamp configured to engage the DUT when the DUT is on the plurality of spacers.

9. The test module of claim 1, wherein the frame is configured to be stacked on another frame of another test module.

10. The test module of claim 1, further comprising:
a status indicator configured to indicate one or more of (i) a status of the test module, or (ii) a status of testing of the DUT.

11. A testing arrangement for mobile devices, the testing arrangement comprising a plurality of test modules, each test module comprising:
a frame;
a test bed coupled to the frame;
a device platform coupled to the test bed and configured to hold a Device Under Test (DUT);
a motion system coupled to the frame and configured to move a carriage assembly horizontally along an X axis and a Y axis, the motion system comprising:
a first belt and a second belt;
a first set of pulleys and a second set of pulleys; and
a first motor and a second motor,
wherein the first belt is engaged with the first set of pulleys and the first motor, and
wherein the second belt is engaged with the second set of pulleys and the second motor;
an actuator arm coupled to the carriage assembly;
an actuator arm mount coupled to the actuator arm, the actuator arm mount configured to move vertically along a Z axis and engage the DUT; and
a controller configured to control the motion system and the actuator arm to perform various tests with respect to the DUT; and
a sliding drawer movably coupled to the frame below the test bed, the sliding drawer being configured to slide at least partially out from below the test bed,
wherein the sliding drawer is movable relative to the test bed, and
wherein the controller is mounted on the sliding drawer.

12. The testing arrangement of claim 11, wherein the actuator arm mount comprises:
a capacitive tip configured to engage a screen of the DUT and one or more user interface (UI) elements of the DUT.

13. The testing arrangement of claim 12, wherein the actuator arm mount of each test module each comprises a shaft and a coil spring coupled to the capacitive tip.

14. The testing arrangement of claim 11, wherein:
the plurality of test modules comprise base test modules configured to be placed on a base; and
the plurality of test modules comprise stackable test modules configured to be stacked on one of (i) a base test module, or (ii) a stackable test module.

15. The testing arrangement of claim 11, wherein each actuator arm further comprises a shaft and a coil spring.

16. The testing arrangement of claim 11, wherein each test module further comprises:
a Radio-Frequency Identification (RFID) antenna mounted on the device platform, the RFID antenna configured to identify the DUT to the controller; and
a camera coupled to the frame above the device platform.

17. The testing arrangement of claim 11, wherein each device platform comprises:
a plurality of spacers configured to support the DUT;
a plurality of adjustable pins configured to engage the DUT; and
a spring-loaded clamp configured to engage the DUT when the DUT is on the plurality of spacers.

18. A test module for testing mobile devices, the test module comprising:
a test bed configured to hold a Device Under Test (DUT);
a motion system coupled to a frame and configured to move a carriage assembly horizontally along an X axis and a Y axis, the motion system comprising:
a first belt and a second belt;
a first set of pulleys and a second set of pulleys; and
a first motor and a second motor,
wherein the first belt is engaged with the first set of pulleys and the first motor, and
wherein the second belt is engaged with the second set of pulleys and the second motor;
an actuator arm coupled to the carriage assembly;
an actuator arm mount coupled to the actuator arm, the actuator arm mount configured to move vertically along a Z axis and engage the DUT;
a controller configured to control the motion system and the actuator arm to perform various tests with respect to the DUT; and
a sliding drawer movably coupled to the frame below the test bed, the sliding drawer being configured to slide at least partially out from below the test bed,
wherein the sliding drawer is movable relative to the test bed, and
wherein the controller is mounted on the sliding drawer.

19. The test module of claim 18, wherein the actuator arm mount comprises:
a capacitive tip configured to engage a screen of the DUT and one or more User Interface (UI) elements of the DUT.

20. The test module of claim 19, wherein the actuator arm mount comprises a shaft and a coil spring coupled to the capacitive tip.

* * * * *